United States Patent [19]

Temple

[11] Patent Number: 5,521,436

[45] Date of Patent: * May 28, 1996

[54] SEMICONDUCTOR DEVICE WITH A FOIL-SEALED LID

[75] Inventor: Victor A. K. Temple, Clifton Park, N.Y.

[73] Assignee: Harris Corporation, Melbourne, Fla.

[*] Notice: The portion of the term of this patent subsequent to Sep. 28, 2010, has been disclaimed.

[21] Appl. No.: 107,309

[22] Filed: Aug. 17, 1993

Related U.S. Application Data

[63] Continuation of Ser. No. 826,003, Jan. 27, 1992, abandoned.

[51] Int. Cl.⁶ .......................... H01L 23/02; H01L 23/12; H01L 23/16
[52] U.S. Cl. .......................... 257/698; 257/678; 257/704; 257/710; 257/774
[58] Field of Search .................................. 257/678, 698, 257/701, 703, 704, 705, 773, 774, 710

[56] References Cited

U.S. PATENT DOCUMENTS

| | | |
|---|---|---|
| 3,059,158 | 10/1962 | Doucette et al. . |
| 3,116,443 | 12/1963 | Forster et al. . |
| 4,249,034 | 2/1981 | Fichot et al. . |
| 4,626,960 | 12/1986 | Hammano et al. . |
| 4,646,129 | 2/1987 | Yerman et al. .......................... 257/774 |
| 5,135,890 | 8/1992 | Temple et al. .......................... 257/774 |
| 5,248,901 | 9/1993 | Temple .................................. 257/704 |

*Primary Examiner*—Sara W. Crane
*Assistant Examiner*—Carl Whitehead, Jr.
*Attorney, Agent, or Firm*—Rogers & Killeen

[57] ABSTRACT

A semiconductor device includes a semiconductor substrate forming the bottom portion of a package of the device and a ceramic plate forming the upper or lid portion of the device. The substrate includes a layer of metal on its upper surface along the substrate outer edge and spaced apart from electrodes on the substrate upper surface. The ceramic plate includes a copper foil on its lower surface along the outer edge thereof which overlaps and is bonded to the substrate metal layer. The ceramic plate has apertures therethrough which are sealed by copper foils on the inside of the package, the foils being bonded to respective ones of the substrate electrodes.

23 Claims, 4 Drawing Sheets

SEMICONDUCTOR DEVICE WITH A FOIL-SEALED LID

This is a continuation of application Ser. No. 826,003, filed Jan. 27, 1992 now abandoned.

BACKGROUND OF THE INVENTION

This invention relates to semiconductor devices, and particularly to the assembly and packaging of such devices.

Semiconductor devices, e.g., power devices, typically comprise a semiconductor chip disposed within a package and connectors for connecting electrodes on the surface of the chip to terminal leads extending from the package.

U.S. Pat. No. 5,028,987 shows one example of a prior art device of a type with which the present invention has utility; the subject matter of this patent being incorporated herein by reference.

In this patent, the package comprises a cup-shaped base to the inside bottom of which is bonded a semiconductor chip; an apertured, ceramic lid bonded to the side wall of the base; and terminal leads bonded to electrodes on the chip and extending from the chip directly through the lid apertures and serving as the device terminals.

In my co-pending patent application, Ser. No. 823,343, filed Jan. 21, 1992, entitled "Semiconductor Devices and Methods of Assembly Thereof", now U.S. Pat. No. 5,248,901 issued Sep. 28, 1993, there is disclosed, among other things, a device similar to the one disclosed in the patent but wherein, in place of the terminal leads bonded to the chip electrodes, thin metal foils bonded to the interior surface of the ceramic lid are used. The metal foils underlie and seal the bottom openings of the lid apertures, and the metal foils overlie and are directly bonded to the chip electrodes. External electrical connections to the device electrodes are by means of terminal leads which extend into the apertures and into electrical contract with the foils thereunder. The device thus comprises a chip tightly sandwiched between the base bottom wall and the lid inner surface, and has the features of great strength, small size, and high thermal conductivity paths for removing heat from both the upper and lower surfaces of the package.

The present invention provides still further improvements in devices of the type described.

SUMMARY OF THE INVENTION

A semiconductor device includes a semiconductor substrate of generally known type including electrodes on an upper surface thereof. The substrate is larger than is conventional, however, and includes a bondable material disposed on the upper surface of the substrate at the outer edge thereof and entirely around the substrate. The bondable material is spaced from the electrodes. The substrate comprises the bottom portion of the device package.

The upper portion of the package comprises an apertured, ceramic lid including metal layers bonded to the bottom surface of the lid. Some of the metal layers, e.g., metal foils, underlie and seal the apertures through the lid and overlie and are directly bonded to the substrate surface electrodes. Another of the metal layers extends around the periphery of the bottom surface of the lid and is bonded to the bondable material around the periphery of the substrate. Terminal leads are optionally included extending into the lid apertures and bonded to the underlying foils.

A method of fabricating the inventive devices comprises disposing a ceramic wafer assembly including an integral army of apertured and metal layered lids in contact with a semiconductor wafer assembly including an integral army of electroded substrates. The substrates also include the bondable material layers which, preferably, have the same thickness as the substrate electrodes. Each of the lids is properly aligned with a respective one of the substrates, and all the lids, including the metal layers thereon, are simultaneously bonded to all the substrates. The bonded together assemblies are then diced to provide the individual, bonded together devices.

In one embodiment, as described hereinafter, the ceramic wafer assembly is pre-diced and held together solely by a web of metal foils. This avoids, as hereinafter described, thermal expansion mismatch problems.

DESCRIPTION OF PREFERRED EMBODIMENTS OF THE INVENTION

Figure 1:
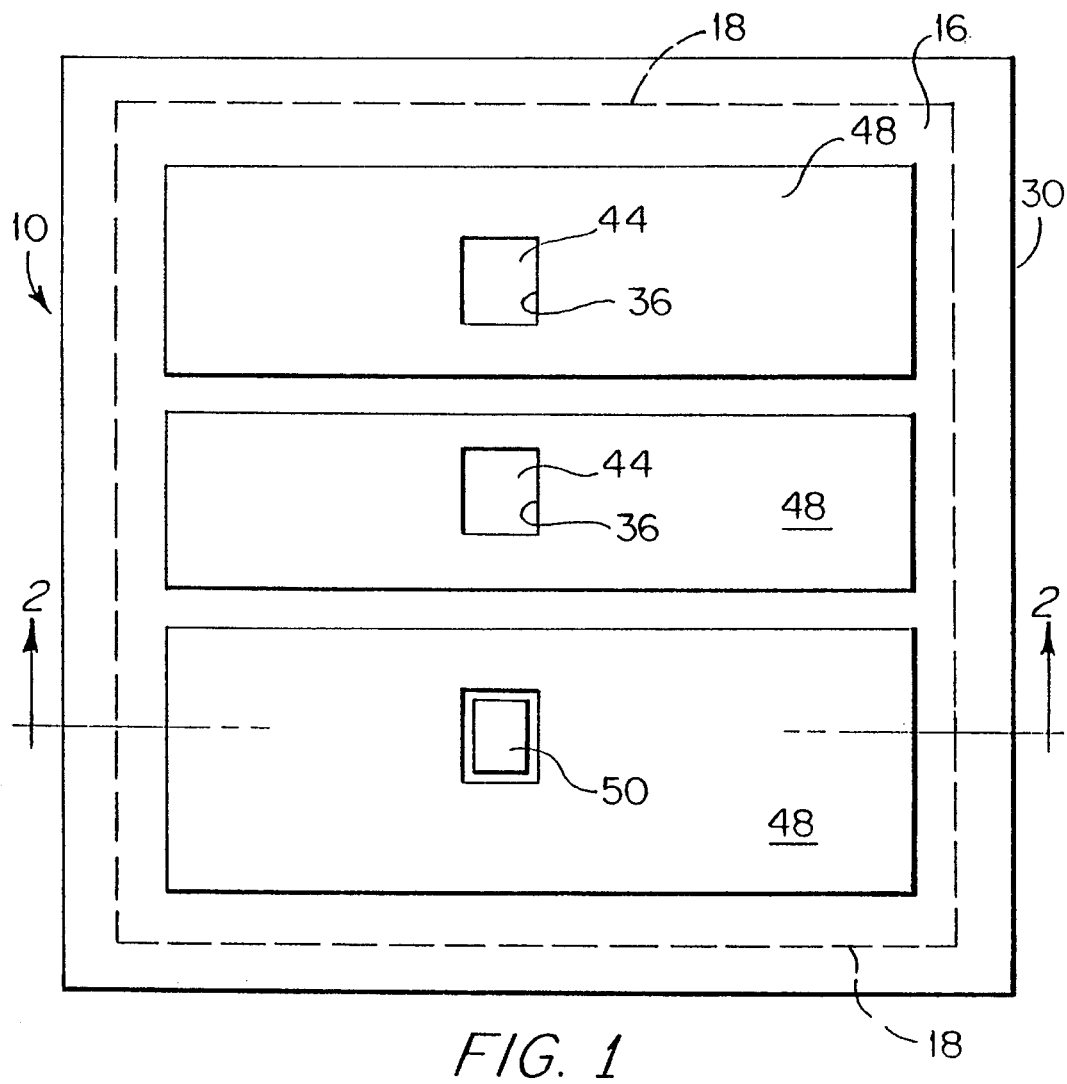
FIG. 1 shows a plan view of a semiconductor device according to this invention.

An individual semiconductor device 10 in accordance with this invention is shown in FIGS. 1–4.

The device 10 comprises a semiconductor substrate 12 which forms the bottom portion of the device package 14, and a ceramic lid 16 forming the upper portion of the package.

Except for a peripheral portion 18 (FIG. 2) of the substrate 12, the substrate can be of conventional design, including various doped regions (not shown) comprising a known type of semiconductor device, e.g., a thyristor in this embodiment. The "active" or semiconductor device defining portions of the substrate 12 are all disposed within a central section 20 (FIG. 2) of the substrate. The anode and gate electrodes 24 of the thyristor are disposed on the upper surface 28 of the substrate, and the cathode electrode 26 is disposed on the substrate lower surface.

The electrodes can comprise, for example, doped polycrystalline silicon coated with a bondable material dependent upon how the device is assembled. This is discussed hereinafter.

In a departure from conventional practice, the substrate 12 has a peripheral portion 18 which extends well beyond the central section 20. For example, with a substrate 12 of 0.4 mm thickness and a rectangular central section 20 of 10 by 12 mm, the width of the peripheral portion 18 is 1.2 mm.

Disposed along the outer edge 30 of the peripheral portion 18 on the upper surface 28 of the substrate is a layer 32 of a bondable material. Preferably, the layer 32 is identical in composition and thickness to the electrodes 24 and is formed simultaneously with the electrodes. Known deposition and patterning processes can be used for forming the electrodes 24 and the layer 32.

The layer 32 forms part of the outside surface of the device package, hence, to provide electrical isolation between the package outside surface and the interior electrodes 24, the layer 32 is spaced from the electrodes 24, e.g., by a minimum distance of 0.6 mm in this embodiment.

The lid 16 of the device package 14 comprises a flat plate 34 of a known ceramic material, e.g., alumina or silicon nitride, having a plurality of apertures 36 therethrough. A number of metal layers are bonded to surfaces of the ceramic plate. While various metals, e.g., aluminum, can be bonded to the ceramic plate, e.g., by sputtering, in the preferred embodiment, all the metal layers on the ceramic plate comprise copper foils having a thickness of 0.12 mm. Techniques for bonding copper foils to ceramics are known and described in various references cited in the aforementioned U.S. Pat. No. 5,028,987.

Bonded to the bottom surface 38 (FIG. 2) of the ceramic plate 34 is a foil 40 which extends entirely around the plate along the outer edge 42 thereof, and three additional foils 44 (FIG. 3) each of which extends across the bottom opening of a respective one of the apertures 36. The foils 44 hermetically seal the apertures 36 from the interior of the device package.

The edge foil 40 of the lid 16 overlaps and is bonded to the bondable material layer 32 of the substrate 12. Each of the three lid foils 44 is aligned with and bonded to a respective one of the substrate electrodes 24.

Bonded to the upper surface 46 of the ceramic plate 34 are three foils 48 (FIG. 1), each of which is disposed around a respective one of the apertures 36. Each foil 48 has an opening therethrough in alignment with its associated aperture.

Figure 2:
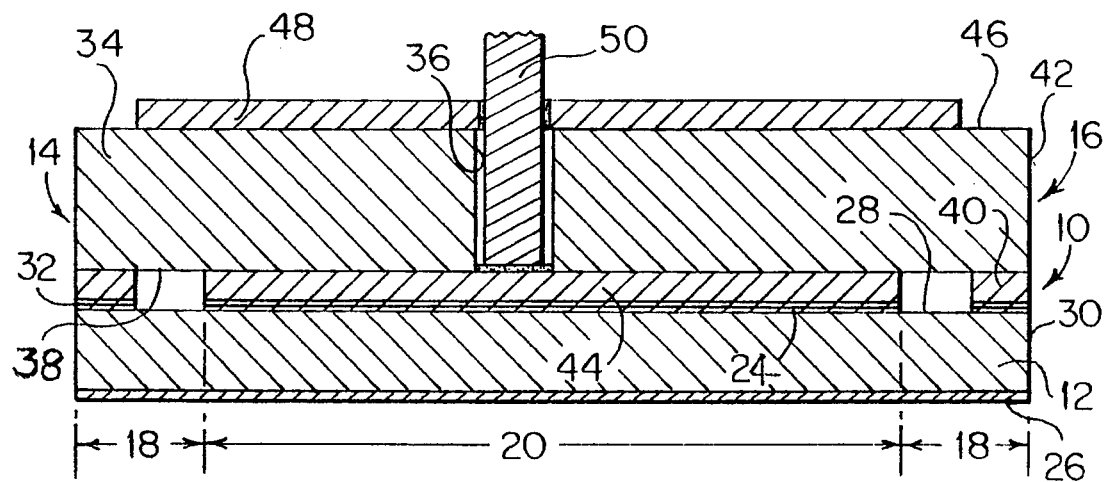
FIG. 2 is a cross-sectional view/taken along line 2—2 of FIG. 1.

In this embodiment, three terminal leads 50 (only one of which is shown in FIGS. 1 and 2), e.g., copper pins, are provided extending into respective ones of the apertures and bonded to the exposed surfaces of the foils 44 underlying the apertures. The leads 50 are also bonded to the foils 48 on the upper surface 46 of the plate 34. Preferably, the leads 50 are solder bonded to the foils 44 and 48.

Alternatively, although not shown, the terminal leads 50 are omitted, and, in the use of the leadless devices, terminal leads projecting from a terminal board, or the like, on which the devices are mounted extend into the apertures 36 and into electrical contact with the interior foils 44. In such lead-less devices, the upper foils 48 are omitted.

Compared to various known devices, such as the one shown in the aforementioned U.S. Pat. No. 5,028,987, the inventive devices, with or without terminal leads, do not include a separate package part enclosing the semiconductor substrate, hence contain fewer parts and are accordingly less expensive. Because the lid 16 is bonded directly to the substrate 12, extremely compact and strong devices are provided. Also, owing to the direct bonding of the lid to the substrate, a high thermal conductivity path is provided through the top portion of the package 14. Thus, in use, heat can be removed from both the upper and lower surfaces of the package by use of upper and lower heat sinks.

Figure 3:
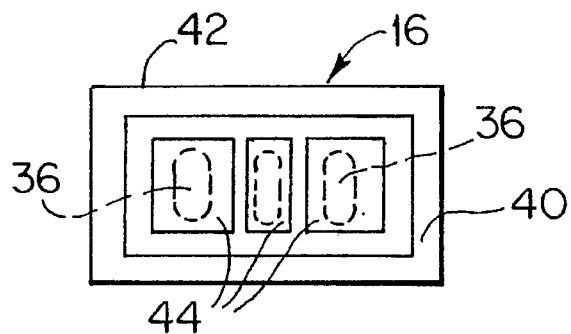
FIG. 3 is a plan view of the interior or bottom surface of the lid portion of the device shown in FIGS. 1 and 2, but to a smaller scale.
Figure 4:
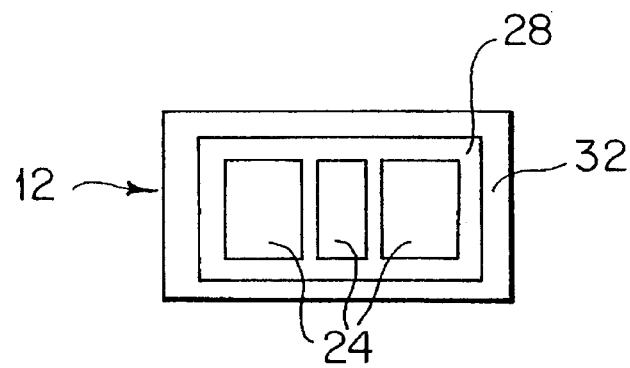
FIG. 4 is a plan view of the top surface of the semiconductor substrate of the device.

In the assembly of the device 10, individual lids 16 as shown in FIG. 3, and individual substrates 12 as shown in FIG. 4, can be provided by generally known means, and the lids and substrates can be bonded together by conventional bonding techniques, such as solder, thermal compression bonding, gold-aluminum reaction bonding, and the like. For the gold-aluminum reaction bonding, a thin layer of gold is provided on the bottom surfaces of the lid foils 40 and 44, and the electrodes 24 and the bondable layer 32 of the substrate are either aluminum or a layer of some other material, e.g., the aforementioned doped polycrystalline silicon, covered with a thin layer of aluminum.

A feature of the inventive devices is that they can be inexpensively assembled using batch processing techniques. This is illustrated in FIGS. 5 through 7.

Figure 5:
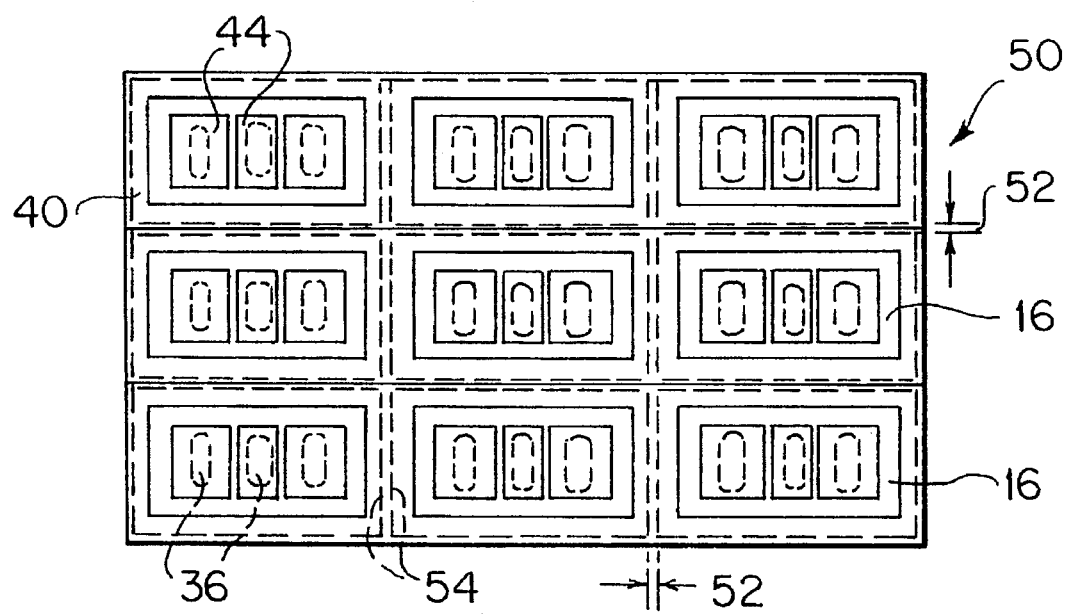
FIG. 5 is a view similar to FIG. 3 but showing a ceramic wafer assembly of lids.
Figure 6:
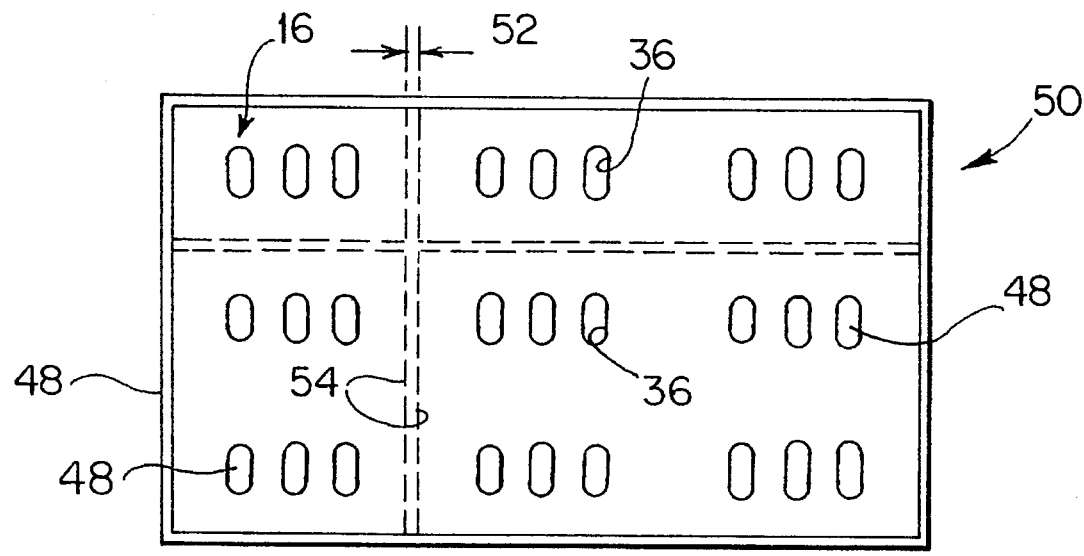
FIG. 6 is a view of the opposite 6 (exterior) surface of the ceramic water assembly shown in FIG. 5.
Figure 7:
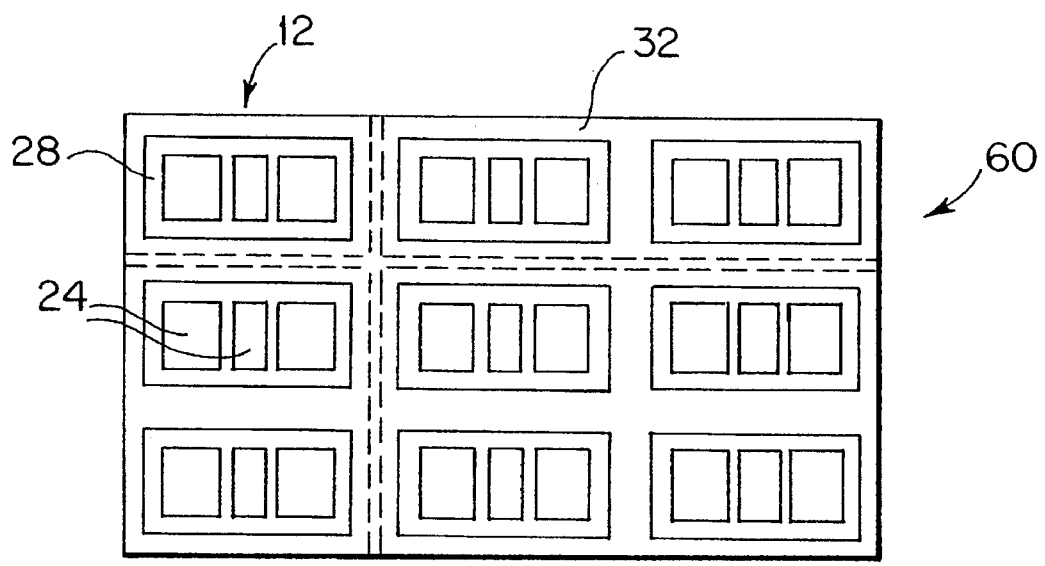
FIG. 7 is a view similar to that of FIG. 4 but showing a semiconductor wafer assembly of substrates.

FIGS. 5 and 6 show the lower and upper surfaces, respectively, of a ceramic wafer assembly 50 including an array of integrally connected lids 16. Each lid 16 is complete in that it is ready to be bonded to a substrate 12, and each lid 16 includes apertures 36 therethrough and the various ceramic foils 40 and 44 bonded thereto. In this embodiment of the invention, the devices being assembled are of the lead-less type (i.e., not including the leads 50 illustrated in FIGS. 1 and 2) and no foils (such as the foils 48 shown in FIG. 1) are provided on the upper surfaces 46 of the lids 16. The lids 16 are aligned in rows and columns, with spaces 52, shown by dashed lines 54, between adjacent lids 16.

In the fabrication of the ceramic wafer assembly 50, an apertured plate of ceramic is formed by known means, and a thin foil of copper is direct bonded to one of the major surfaces of the ceramic plate. Then, using known photolithographic techniques, the foil is patterned to the individual foils 40 and 44 shown in FIG. 5. If the semiconductor devices being assembled are of the type which are to include leads 50 (FIG. 1), then another foil is direct bonded to the other major surface of the ceramic plate and similarly patterned to provide a repetitive pattern (not shown) of foils 48 corresponding to the pattern of foils 48 shown in FIG. 1.

FIG. 5 shows that the lid peripheral bonding layers 40 on the bottom surface 38 of the ceramic plate comprise a continuous layer or web surrounding the individual lids 16. An advantage of this, at least in some instances, is discussed hereinafter.

FIG. 7 shows the upper surface 28 of a semiconductor wafer assembly 60 including an array of integrally connected substrates 12. The bottom surface of the assembly is not illustrated because it comprises merely an unfeatured continuous electrode 26 covering the entire bottom surface of the wafer assembly 60.

Each substrate 12 included in the assembly 60 is complete in that it is ready to be bonded to a lid 16. Thus, each substrate 12 includes various doped regions providing the desired semiconductor device characteristics, the electrodes 24 and 26, and the bondable peripheral layer 32 on the substrate upper surface 28. Also, similarly as the lid 16, spaces 52 are provided between the individual substrates 12.

The fabrication of semiconductor wafers, including arrays of semiconductor substrates, is well known and not described herein. As previously described, the peripheral bonding layers 32 are preferably of the same materials as that of the electrodes 24, and are preferably and conveniently formed at the same time and with the same processes used to form the electrodes.

The two wafer assemblies 50 and 60 are then clamped together in proper alignment of lids to substrates, and all the bonds between the various contacting metal surfaces are made using known bonding techniques such as those previously described in connection with the bonding together of individual lids and substrates.

After the bonding together of the two wafer assemblies 50 and 60, the various semiconductor devices (without leads) have basically been completed except that they are connected together. However, because the device electrodes 24 are readily accessible through the lid apertures 36, testing of the various devices is preferably performed prior to the dicing of the bonded assemblies.

This is advantageous in that it reduces device handling, hence can be economically performed. The results of the testing can be code marked, e.g., by ink, on each device.

Figure 8:
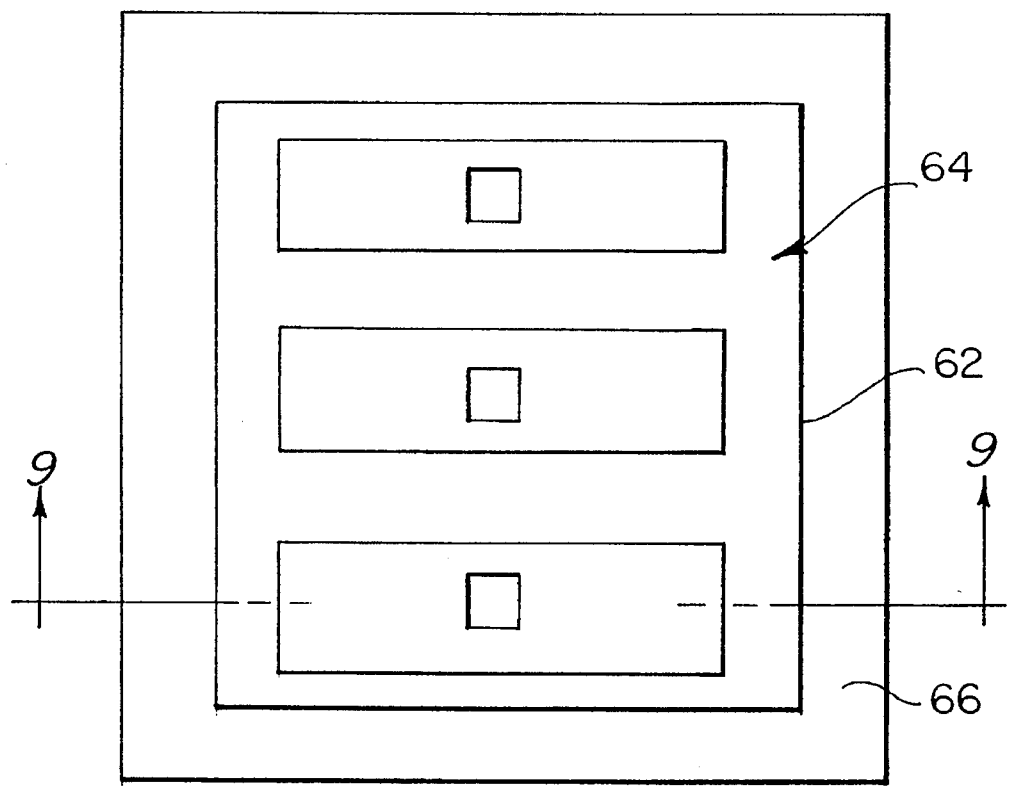
FIGS. 8 and 9 are views similar to FIGS. 1 and 2, respectively, and showing another embodiment of the invention.

Then, if devices of the type shown in FIG. 8 are being made, the various terminal leads 50 are inserted into the lid apertures 36 and bonded to the foils 44. Again, cost savings can be achieved by use of batch lead loading processes.

Finally, the individual devices, or groups of devices in various preselected patterns of devices, are diced from the bonded assemblies by known means, such as sawing and slicing (i.e., sawing through the ceramic and silicon wafers, and then slicing, as with a razor blade, through the metal layers 32 and 40). The saw cuts are made through the spaces 52 shown in FIGS. 5–7.

As previously noted, in some instances, the webbed pattern of the metal layer 40 on the wafer assembly 50 provides an advantage. This arises when the coefficient of thermal expansion of the ceramic material of the wafer assembly 50 is significantly different from that of the semiconductor material of the wafer assembly 60. In such instances, because heat is necessary during the bonding together of the two assemblies, the different thermal expansions of the two assemblies can give rise to misalignment of the various assembly parts with respect to one another. Also, mechanical stresses can be produced in the bonds which harden while the assemblies are still cooling but contracting at different rates.

Such situations can arise, for example, when the ceramic of the wafer assembly 50 is aluminum oxide and the semiconductor material of the assembly 60 is silicon; the coefficient of thermal expansions of these materials differing by around 50%. (Conversely, when the ceramic is aluminum nitride, the coefficient of expansion mismatch with silicon is only 1%, and the aforementioned thermal mismatch problems are not present.)

To avoid the thermal mismatch problems, the ceramic plate portion of the wafer assembly 50 is diced along the spaces 52 prior to the bonding together of the two assemblies 50 and 60. The webbed metal layer 40 is not cut through, however, and the metal web holds together the array of individual lids (now spaced apart by the amount of ceramic material removed during the dicing operation). Using a saw, for example, the lid spacings 52 can be around 3.5 mils (0.1 mm). During bonding together of the two assemblies 50 and 60, the spaces between the lids 16 accommodate the expansion mismatches, thereby avoiding the aforementioned problems.

Figure 9:
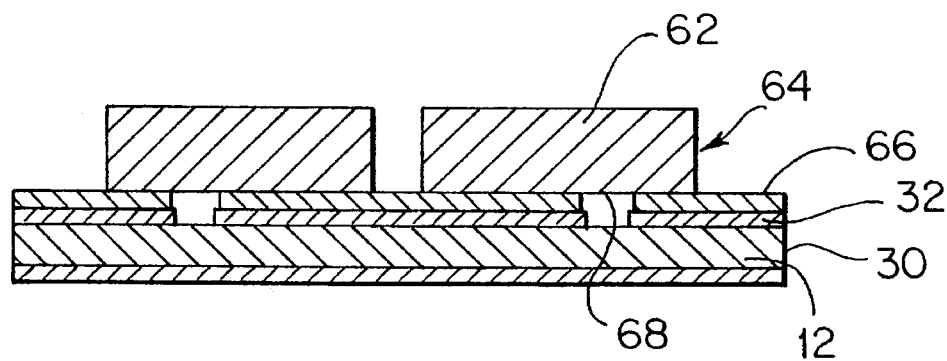

FIGS. 8 and 9 show a variation of the device 10 shown in FIGS. 1 and 2. In this embodiment, the ceramic plate 62 of the lid 64 has smaller lateral dimensions than the substrate 12, and the edge 65 of the plate 62 terminates inwardly of the edge 30 of the substrate 12. Also, the bonding layer 66 on the bottom surface 68 of the plate 62 comprises a copper foil which extends laterally outwardly from the plate edge 65 and in overlapped relation with the bondable layer 32 of the substrate 12.

An advantage of this embodiment is that owing to the flexibility of the thin metal foil 66, e.g., of thickness of 0.1 mm and an extending length of 2 mm, larger dimensional tolerances of the device parts can be accommodated while still providing proper surface to surface mating of the lid and substrate. However, while the flexible, extending foil 66 provides an advantage in the fabrication of individual devices, the use of the extending foil 66 is not generally preferred in batch fabrication processes using lid and substrate wafer assemblies. One reason is that, to conserve space, the spacings 52 between lids on the lid assembly are as small as possible, hence it is difficult to insert bonding tools between the lids to apply pressure against the upper surfaces of the foils 66 as is necessary for bonding them to the substrate layers 32.

What is claimed is:

1. A semiconductor device comprising:

a semiconductor substrate having upper and lower surfaces, electrodes on said upper surface spaced from an outer edge of said surface, and a bondable material layer on said upper surface along said outer edge and spaced from said electrodes;

a lid forming an upper portion of a package of said device, said lid having upper and lower surfaces and apertures extending through said lid between said upper and lower surfaces, said apertures having openings in said upper and lower surfaces;

metal foils bonded to the lid lower surface, each of said foils extending across and sealing the opening in said lid lower surface of a respective aperture, said foils overlying and being bonded to respective ones of said electrodes; and a bondable layer on said lid lower surface along an outer edge of said surface overlying and bonded to said bondable layer on said substrate upper surface, said substrate forming a lower portion of the package of said device.

2. A device according to claim 1 wherein said package consists of said upper and lower portions.

3. A device according to claim 1 including a terminal lead disposed within each of said apertures, each said lead having two ends, one of which is bonded to the foil extending across the opening of the aperture in which the lead is disposed and the other of which is spaced upwardly from the upper surface of said lid.

4. A device according to claim 1 wherein said electrodes have flat upper surfaces, said foils have flat lower surfaces, and said foils are bonded to said electrodes in flat, surface to surface contact.

5. A semiconductor device comprising:

a semiconductor substrate forming a lower portion of the package of the device and having an electrode on an upper surface thereof;

a lid forming an upper portion of the device and having a lower surface overlying said substrate said lid comprising, an aperture extending from an upper surface to the lower surface, and a foil bonded to the lower surface that seals said aperture and that is bonded to said electrode; and said lid lower surface being affixed to said substrate upper surface along the entire peripheries thereof spaced from said electrode to hermetically seal and substrate upper surface.

6. The device of claim 5 further comprising a bond between said lid lower surface and said substrate upper surface at the peripheries thereof.

7. The device of claim 6 wherein said bond between said lid and said substrate comprises a first layer of bondable material on said substrate upper surface along an outer edge thereof spaced from said electrode and a second layer of bondable material on said lid lower surface overlying and bonded to said first layer to hermetically seal said substrate upper surface.

8. The device of claim 7 wherein said bond that seals said foil to said lower surface hermetically seals said aperture.

9. The device of claim 5 wherein said foil bonds comprise a bond selected from the group consisting of direct bond, solder bond, thermal compression bond, and gold-aluminum reaction bond.

10. The device of claim 5 wherein said lid comprises a ceramic material selected from the group consisting of alumina and silicon nitride.

11. The device of claim 5 wherein said foil comprises an electrically conductive metal selected from the group consisting of aluminum and copper.

12. The device of claim 5 wherein said lid lower surface is generally coextensive with said substrate upper surface.

13. The device of claim 5 wherein said lid lower surface has a smaller surface area than said substrate upper surface.

14. The device of claim 5 further comprising a lead disposed within said aperture, said lead having one end in an electrically conductive relationship with said foil.

15. The device of claim 5 further comprising an electrode on a lower surface of said substrate.

16. A package semiconductor device comprising:
   a semiconductor substrate with an electrode on a first surface thereof and a first affixable layer on the periphery of the first surface spaced from said electrode, said substrate being a lower portion of the package;
   a ceramic lid on said substrate and having a foil bonded to a second surface of said lid that is also bonded to said electrode, said lid having a second affixable layer on a periphery of the second surface;
   an electrical connection for said electrode extending through said lid and into an electrically conductive relationship with said foil; and
   said first affixable layer being affixed to said second affixable layer along the entire peripheries of said lid and said substrate to hermetically seal said first surface.

17. The device of claim 16 further comprising plural said electrodes, plural said foils, and plural said electrical connections.

18. The device of claim 16 further comprising a bond between said lid and said substrate at the peripheries thereof for hermetically sealing said substrate surface with an electrode.

19. The device of claim 18 wherein said bond between said lid and said substrate comprises a first layer of bondable material on said substrate along an outer edge thereof spaced from said electrode and a second layer of bondable material on said lid overlying and bonded to said first layer.

20. The device of claim 5 wherein said device is a power device.

21. The device of claim 5 further comprising plural ones of said electrode, plural ones of said aperture and plural ones of said foil, with one said aperture and one said foil for each said electrode.

22. The packaged device claim 16 wherein said device is a power device.

23. The packaged device of claim 16 further comprising plural ones of said electrode and plural ones of said foil, with one said foil for each said electrode.

* * * * *